USO09159689B1

United States Patent
Park

(10) Patent No.: US 9,159,689 B1
(45) Date of Patent: Oct. 13, 2015

(54) SEMICONDUCTOR DEVICES HAVING THROUGH ELECTRODES, METHODS OF MANUFACTURING THE SAME, AND SEMICONDUCTOR PACKAGES INCLUDING THE SAME

(71) Applicant: SK HYNIX INC., Icheon (KR)

(72) Inventor: Wan Choon Park, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/452,374

(22) Filed: Aug. 5, 2014

(30) Foreign Application Priority Data

Mar. 28, 2014 (KR) ........................ 10-2014-0036525

(51) Int. Cl.
*H01L 21/768* (2006.01)
*H01L 23/00* (2006.01)
*H01L 27/118* (2006.01)
*H01L 25/065* (2006.01)

(52) U.S. Cl.
CPC .............. *H01L 24/14* (2013.01); *H01L 25/065* (2013.01); *H01L 27/11898* (2013.01); *H01L 2224/1148* (2013.01); *H01L 2224/14051* (2013.01); *H01L 2224/14181* (2013.01); *H01L 2225/06513* (2013.01); *H01L 2225/06541* (2013.01)

(58) Field of Classification Search
CPC .. H01L 24/14; H01L 27/11898; H01L 25/065
See application file for complete search history.

(56) References Cited

U.S. PATENT DOCUMENTS 8,963,336 B2 * 2/2015 Jung et al. ..................... 257/774

FOREIGN PATENT DOCUMENTS

KR 10-2013-0062737 A 6/2013

* cited by examiner

*Primary Examiner* — Long Pham

(57) ABSTRACT

A semiconductor device includes a semiconductor layer having a first surface and a second surface, a through electrode penetrating the semiconductor layer and having a protruding portion that protrudes over the second surface of the semiconductor layer, a front-side bump disposed on the first surface of the semiconductor layer and electrically coupled to the through electrode, a passivation pattern including a first insulation pattern that surrounds a sidewall of the protruding portion of the through electrode and extends onto the second surface of the semiconductor layer and a second insulation pattern that covers the first insulation pattern and has an etch selectivity with respect to the first insulation pattern, and a back-side bump covering an end surface of the protruding portion of the through electrode and extending onto the passivation pattern.

7 Claims, 14 Drawing Sheets

SEMICONDUCTOR DEVICES HAVING THROUGH ELECTRODES, METHODS OF MANUFACTURING THE SAME, AND SEMICONDUCTOR PACKAGES INCLUDING THE SAME

CROSS-REFERENCE TO RELATED APPLICATION

The present application claims priority under 35 U.S.C 119(a) to Korean Patent Application No. 10-2014-0036525, filed on Mar. 28, 2014, in the Korean Intellectual Property Office, which is incorporated herein by reference in its entirety as set forth in full.

BACKGROUND

1. Technical Field

Embodiments of the present disclosure relate to semiconductor devices having through electrodes, methods of manufacturing the same, and semiconductor packages including the same.

2. Related Art

Ultra small-sized semiconductor devices with a large storage capacity are increasingly in demand with the development of smaller, high performance electronic products. A plurality of semiconductor chips may be assembled in a single semiconductor package to increase a data storage capacity of the semiconductor device. That is, the data storage capacity of semiconductor devices may be readily increased using a multi-chip packaging technique.

However, even though the multi-chip packaging technique may increase the data storage capacity of the semiconductor device, it may be difficult to obtain a sufficient space for electrical connections between a plurality of semiconductor chips in the multi-chip package as the number of the semiconductor chips increases. Recently, through silicon vias (TSVs) have been proposed to resolve limitations of the multi-chip packaging technique. TSVs may be formed to penetrate a plurality of chips at a wafer level, and the chips stacked in a package may be electrically and physically connected to each other by the TSVs. Accordingly, if TSVs are employed in the packages, the performance and the storage capacity of the packages may be improved.

SUMMARY

Various embodiments are directed to semiconductor devices having through electrodes, methods of manufacturing the same, and semiconductor packages including the same.

According to some embodiments, a semiconductor device includes a semiconductor layer having a first surface and a second surface, a through electrode penetrating the semiconductor layer to have a protrusion that protrudes over the second surface of the semiconductor layer by a predetermined height, a front-side bump disposed on the first surface of the semiconductor layer and electrically coupled to the through electrode, a passivation pattern including a first insulation pattern that surrounds a sidewall of the protrusion of the through electrode and extends onto the second surface of the semiconductor layer and a second insulation pattern that covers the first insulation pattern and has an etch selectivity with respect to the first insulation pattern, and a back-side bump covering an end surface of the protrusion of the through electrode and extending onto the passivation pattern.

According to further embodiments, a semiconductor device includes a semiconductor layer having a first surface and a second surface, a through electrode penetrating the semiconductor layer to have a protrusion that protrudes over the second surface of the semiconductor layer by a predetermined height, a front-side bump disposed on the first surface of the semiconductor layer and electrically connected to the through electrode, a passivation pattern surrounding a sidewall of the protrusion of the through electrode and extending onto the second surface of the semiconductor layer, and a back-side bump covering an end surface of the protrusion of the through electrode and extending onto the passivation pattern. The passivation pattern has a first thickness at a position under the back-side bump and a second thickness at a position on the second surface of the semiconductor layer that does not overlap with the back-side bump.

According to further embodiments, a method of manufacturing a semiconductor device includes providing a wafer including a through electrode and a front-side bump that is formed on a first surface of the wafer and electrically connected to the through electrode, recessing a second surface of the wafer to form a protrusion of the through electrode that protrudes from the recessed second surface of the wafer by a predetermined height, forming a passivation pattern that surrounds a sidewall of the protrusion of the through electrode and covers the recessed second surface of the wafer, and forming a back-side bump that covers the protrusion of the through electrode and extends onto the passivation pattern. The passivation pattern is formed to include at least two insulation patterns having different etch rates.

According to further embodiments, a semiconductor package includes a package substrate, a first semiconductor chip mounted on the package substrate, and at least one additional semiconductor chip stacked on a surface of the first semiconductor chip opposite to the package substrate. Each of the first semiconductor chip and the at least one additional semiconductor chip includes a semiconductor layer, a through electrode penetrating the semiconductor layer to have a protrusion that protrudes from a back-side surface of the semiconductor layer, a front-side bump disposed on a front side surface of the semiconductor layer and electrically connected to the through electrode, a back-side bump disposed over the back-side surface of the semiconductor layer and electrically connected to the protrusion of the through electrode, and a passivation pattern surrounding a sidewall of the protrusion of the through electrode and extending onto the back-side surface of the semiconductor layer.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

Figure 1:
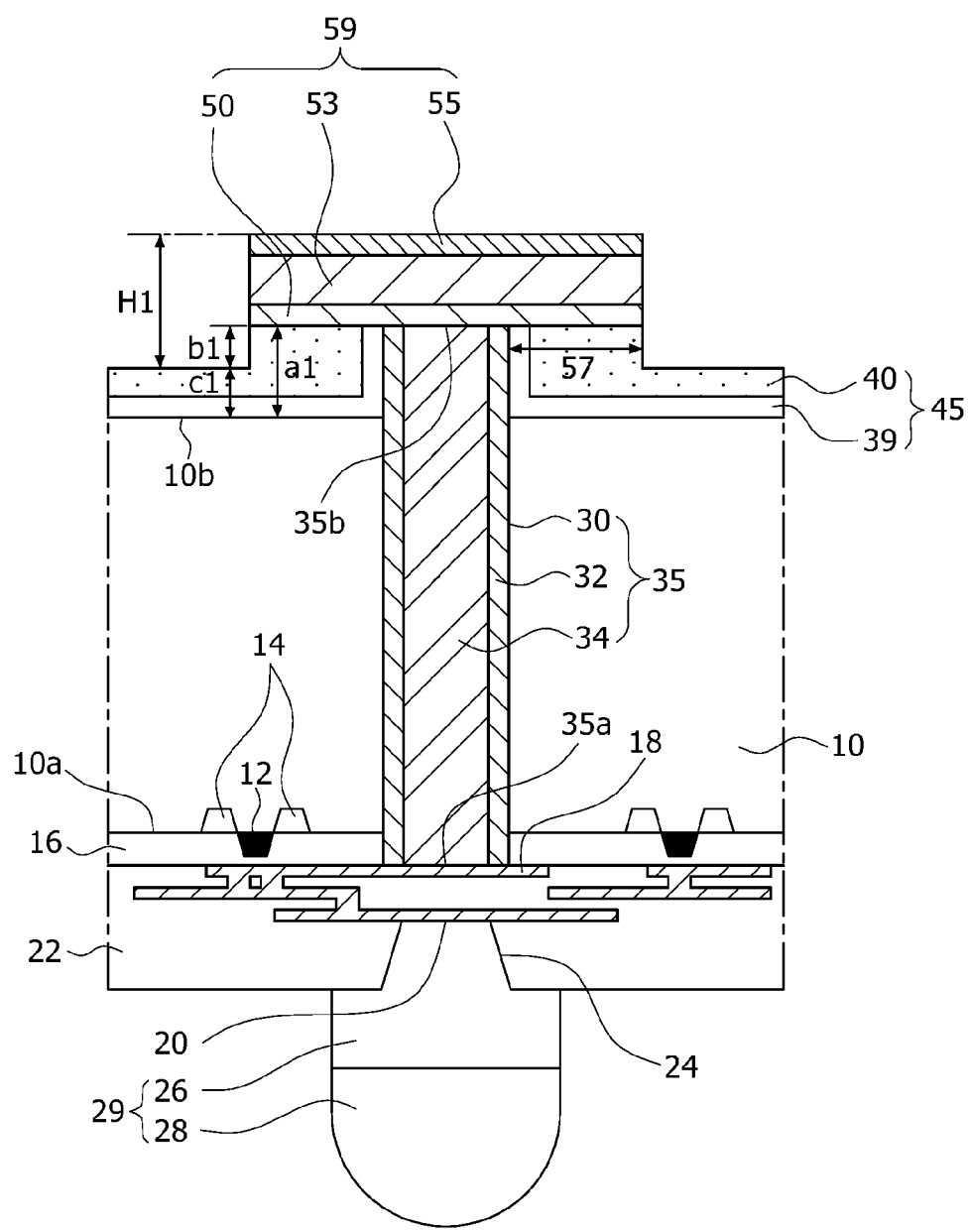
FIG. 1 is a cross-sectional view illustrating a semiconductor device according to an embodiment.

Referring to FIG. 1, a semiconductor device includes a semiconductor layer 10, a through electrode 35 penetrating the semiconductor layer 10, a front-side bump 29 disposed on a first surface 10a of the semiconductor layer 10 and electrically coupled to the through electrode 35, and a back-side bump 59 disposed on a second surface 10b of the semiconductor layer 10 opposite to the front-side bump 29 and electrically coupled to the through electrode 35.

The first surface 10a may correspond to a front-side surface of the semiconductor layer 10 adjacent to active regions, and the second surface 10b may correspond to a back-side surface of the semiconductor layer 10 opposing the first surface 10a. Source/drain regions 14 of transistors are disposed in the active regions adjacent to the first surface 10a, and gate electrodes 12 of the transistors are disposed on the first surface 10a. The first surface 10a of the semiconductor layer 10 and the gate electrodes 12 of the transistors are covered with an interlayer insulation layer 16. Circuit patterns 18 such as bit lines for applying electrical signals to the transistors may be disposed on a surface of the interlayer insulation layer 16 opposite to the semiconductor layer 10.

The through electrode 35 may include a through metal electrode 34 filling a through hole 30 penetrating the semiconductor layer 10 from the first surface 10a toward the second surface 10b. The through metal electrode 34 may include, for example, a copper material. The through electrode 35 may further include a barrier layer 32 that is disposed between the through metal electrode 34 and the semiconductor layer 10 and surrounds a sidewall of the through metal electrode 34. The barrier layer 32 may suppress or prevent metal atoms in the through metal electrode 34 from being diffused into the semiconductor layer 10.

The through electrode 35 may include a first end surface 35a adjacent to the first surface 10a of the semiconductor layer 10 and a second end surface 35b adjacent to the second surface 10b of the semiconductor layer 10. The first end surface 35a of the through electrode 35 may be electrically connected to the circuit patterns 18. The circuit patterns 18 may be electrically connected to a bonding pad 20 which is electrically connected to an external circuit substrate (not shown), and the bonding pad 20 may be exposed by an opening 24 of an insulation layer 22 that covers the circuit patterns 18.

The front-side bump 29 is attached to the exposed portion of the bonding pad 20. The front-side bump 29 may include a metal pillar 26 filling the opening 24 and a solder bump 28 disposed on a surface of the metal pillar 26 opposite to the bonding pad 20. The metal pillar 26 may include a copper material.

The second end surface 35b of the through electrode 35 may protrude from the second surface 10b of the semiconductor layer 10 by a predetermined height. That is, the through electrode 35 may have a protrusion adjacent to the second surface 10b of the semiconductor layer 10. The second end surface 35b of the through electrode 35 may contact the back-side bump 59. The back-side bump 59 may include a seed metal pattern 50, a first metal layer 53 and a second metal layer 55 which are sequentially stacked on the second end surface 35b of the through electrode 35. The seed metal pattern 50 may include a copper material, and the first metal layer 53 may include a copper material. The second metal layer 55 may include a nickel material or a gold material.

A passivation pattern 45 may be disposed between the back-side bump 59 and the semiconductor layer 10. The passivation pattern 45 may surround a sidewall of the protrusion of the through electrode 35 that protrudes from the second surface 10b of the semiconductor layer 10 and may cover a bottom surface of the back-side bump 59. That is, the passivation pattern 45 may have a first width 57 corresponding to a distance from the protrusion of the through electrode 35 to a sidewall of the back-side bump 59. In some embodiments, the passivation pattern 45 may laterally extend to cover an entire portion of the second surface 10b of the semiconductor layer 10.

The passivation pattern 45 may include at least two different material layers. For example, the passivation pattern 45 may include a first insulation pattern 39 and a second insulation pattern 40 having an etch selectivity with respect to the first insulation pattern 39, and the first and second insulation patterns 39 and 40 are sequentially stacked on the second surface 10b of the semiconductor layer 10. The first insulation pattern 39 may include a nitride layer, and the second insulation pattern 40 may include a material having an etch selectivity with respect to the nitride layer. For example, if the first insulation pattern 39 includes a nitride layer, the second insulation pattern 40 may include an oxide layer.

Although FIG. 1 illustrates an example in which the passivation pattern 45 includes two layers of the first and second insulation patterns 39 and 40, embodiments are not limited thereto. For example, the passivation pattern 45 may have a multi-layered structure which is formed by and repeatedly stacking at least two different material layers in an alternating pattern. The back-side bump 59 may have a planar area which is greater than a planar area of the protrusion of the through electrode 35. That is, the back-side bump 59 may cover the second end surface 35b of the through electrode 35 and may laterally extend onto the passivation pattern 45 by the first width 57, effectively increasing the planar area of the back-side bump beyond a width of the through electrode 35.

In some embodiments, a portion of the passivation pattern 45 disposed under the back-side bump 59 may have a first thickness a1, and a portion of passivation pattern 45 at a position on the second surface 10b of the semiconductor layer 10 that does not overlap with the back-side bump 59 has second thickness c1 which is less than the first thickness a1. A top surface of the portion of the passivation pattern 45 having the second thickness c1 may be lower than a top surface of the portion of the passivation pattern 45 having the first thickness a1 by a predetermined depth b1. Thus, a height H1 of the back-side bump 59 is increased by the predetermined depth b1 relative to a device in which the passivation pattern 45 has an even thickness a1. As a result, when a plurality of semiconductor layers 10 including the through electrodes 35 and the bumps 29 and 59 are vertically stacked, electrical connections between the stacked semiconductor layers 10 may be more successfully made because the back-side bump 59 has the height H1 which is relatively increased by the predetermined depth b1.

Figure 2:
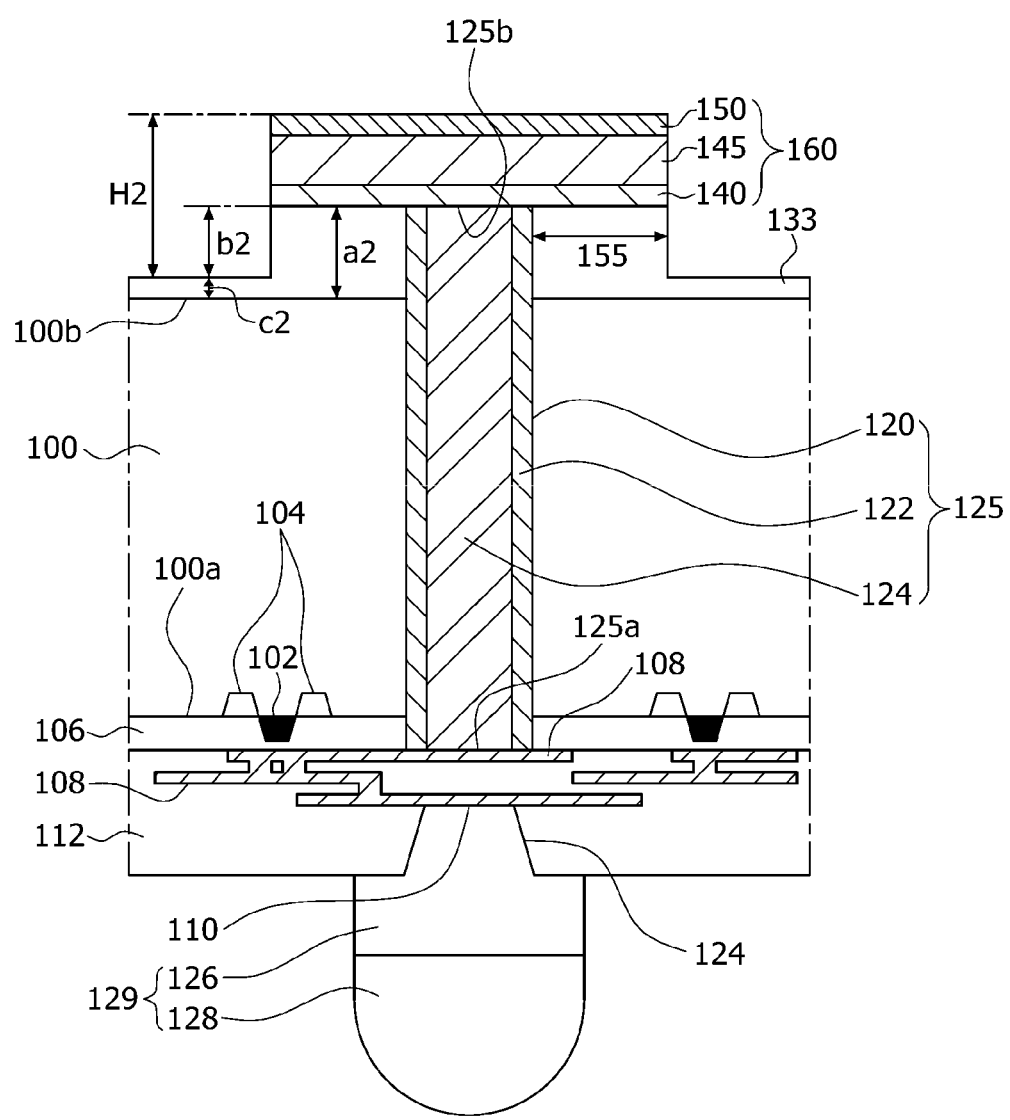
FIG. 2 is a cross-sectional view illustrating a semiconductor device according to another embodiment.

Referring to FIG. 2, a semiconductor device according to another embodiment include a semiconductor layer 100, a through electrode 125 penetrating the semiconductor layer 100, a front-side bump 129 disposed on a first surface 100a of the semiconductor layer 100 and electrically connected to the through electrode 125, and a back-side bump 160 disposed on a second surface 100b of the semiconductor layer 100 opposite to the front-side bump 129 and electrically connected to the through electrode 125. The first surface 100a may correspond to a front-side surface of the semiconductor layer 100 adjacent to active regions, and the second surface 100b may correspond to a back-side surface of the semiconductor layer 100 opposing the first surface 100a. Source/drain regions 104 of transistors may be disposed in the active regions adjacent to the first surface 100a, and gate electrodes 102 of the transistors may be disposed on the first surface 100a. The first surface 100a of the semiconductor layer 100 and the gate electrodes 102 of the transistors may be covered with an interlayer insulation layer 106, and circuit patterns 108 may be disposed on a surface of the interlayer insulation layer 106 opposite to the semiconductor layer 100.

The through electrode 125 may include a through metal electrode 124 filling a through hole 120 penetrating the semiconductor layer 100. The through metal electrode 124 may include, for example, a copper material. The through electrode 125 may further include a barrier layer 122 that is disposed between the through metal electrode 124 and the semiconductor layer 100 to surround a sidewall of the through metal electrode 124. The barrier layer 122 may suppress or prevent metal atoms in the through metal electrode 124 from being diffused into the semiconductor layer 100. The through electrode 125 may include a first end surface 125a adjacent to the first surface 100a of the semiconductor layer 100 and a second end surface 125b adjacent to the second surface 100b of the semiconductor layer 100. The first end surface 125a of the through electrode 125 may be electrically connected to the circuit patterns 108. The circuit patterns 108 may be electrically connected to a bonding pad 110, and the bonding pad 110 may be exposed by an opening 124 of an insulation layer 112 that covers the circuit patterns 108.

The front-side bump 129 may be attached to the exposed bonding pad 110. The front-side bump 129 may include a metal pillar 126 filling the opening 124 and a solder bump 128 disposed on a surface of the metal pillar 126 opposite to the bonding pad 120.

The second end surface 125b of the through electrode 125 may protrude from the second surface 100b of the semiconductor layer 100 by a predetermined height. That is, the through electrode 125 may have a protrusion adjacent to the second surface 100b of the semiconductor layer 100. A sidewall of the protrusion of the through electrode 125 and the second surface 100b of the semiconductor layer 100 may be covered by a passivation pattern 133. The second end surface 125b of the through electrode 125 may contact the back-side bump 160. The back-side bump 160 may laterally extend from the sidewall of the protrusion of the through electrode 125 by a first width 155 to cover a portion of the passivation pattern 133. The passivation pattern 133 may have a single material layer. For example, the passivation pattern 133 may be formed of a single nitride layer. The passivation pattern 133 may cover the sidewall of the protrusion of the through electrode 125 and prevent the protruding portion of the through electrode 125 from being damaged.

A portion of the passivation pattern 133 at a position under the back-side bump 160 may have a first thickness a2, and a portion at a position on the second surface 100b of the semiconductor layer 100 that does not overlap with the back-side bump 160 may have a second thickness c2 which is less than the first thickness a2. A top surface of the portion of the passivation pattern 133 having the second thickness c2 may be lower than a top surface of the portion of the passivation pattern 133 having the first thickness a2 by a predetermined depth b2. Thus, a height H2 of the back-side bump 160 may be increased from the top surface of the passivation pattern 133 having the second thickness c2 by the predetermined depth b2. Due to the back-side bump 160 having the height H1 increased by predetermined depth b2, when a plurality of semiconductor layers 100 including the through electrodes 125 and the bumps 129 and 160 are vertically stacked, electrical connections between the stacked semiconductor layers 100 may be more successfully made because the back-side bump 160 has the height H2 which is relatively increased by the predetermined depth B2.

The back-side bump 160 may include a seed metal pattern 140, a first metal layer 145 and a second metal layer 150 which are sequentially stacked on the second end surface 125b of the through electrode 125. The back-side bump 160 may have a planar area which is greater than a planar area of the protrusion of the through electrode 125. That is, the back-side bump 160 may cover the second end surface 125b of the through electrode 125 and may laterally extend onto the passivation pattern 133 by the first width 155 to increase a planar area thereof.

Figure 3:
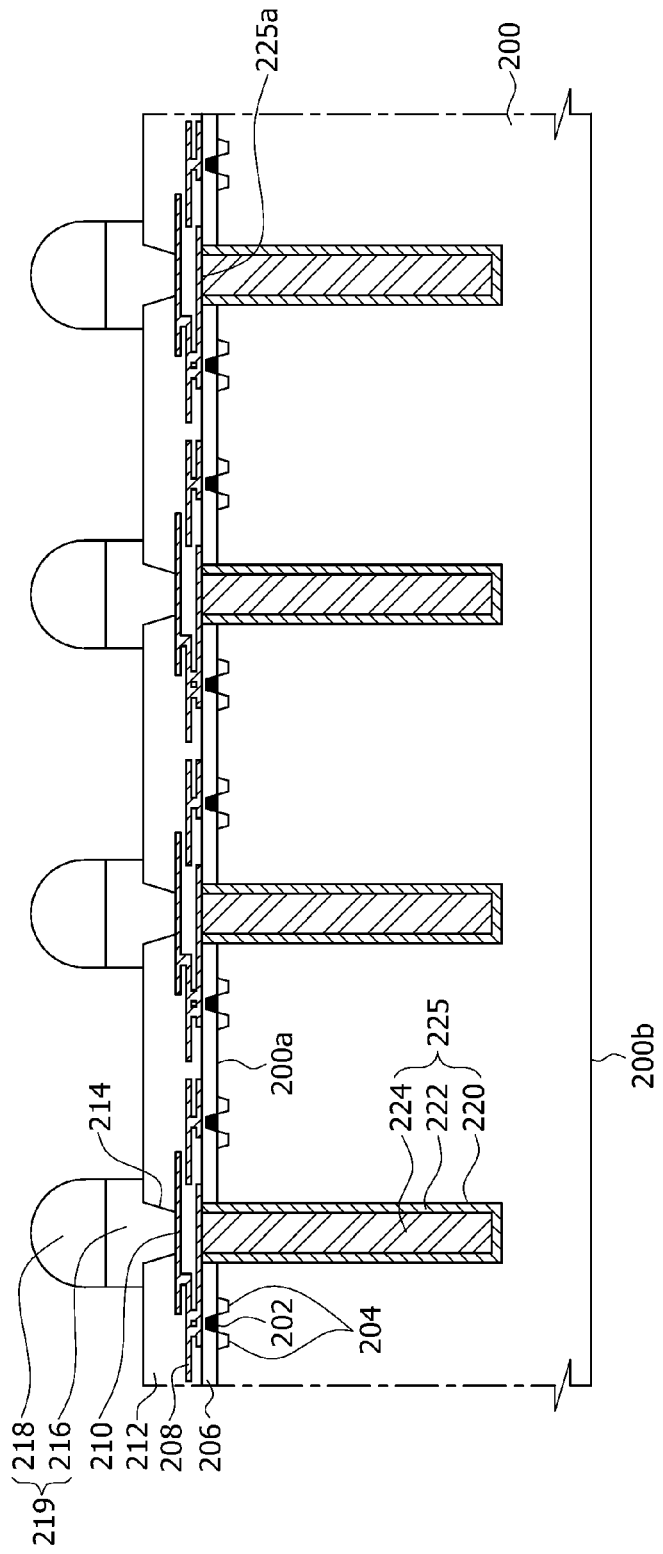
FIGS. 3 to 12 are cross-sectional views illustrating a method of manufacturing a semiconductor device according to an embodiment.

A method of manufacturing a semiconductor device according to an embodiment will now be described with respect to FIGS. 3 to 12. Referring to FIG. 3, a wafer 200 having through electrodes 225 and front-side bumps 219 electrically connected to the through electrodes 225 may be provided. The wafer 200 may be, for example, a silicon wafer having a front-side surface 200a and a back-side surface 200b on opposite sides. The wafer 200 may be a substrate that is used in fabrication of semiconductor memory devices, semiconductor logic devices, photo devices or display units. The front-side surface 200a may be adjacent to active regions in which active elements or passive elements are formed, and the back-side surface 200b may be a surface on an opposite side of wafer 200 from the front-side surface 200a.

Transistors may be formed on and in the wafer 200 and adjacent to the front-side surface 200a. Each of the transistors may include a gate electrode 202 and source/drain regions 204. An interlayer insulation layer 206 may be formed on the front-side surface 200a to cover the transistors, and circuit patterns 208 such as bit lines may be formed in or on the interlayer insulation layer 206. Electrical signals may be applied to the gate electrode 202 and the source/drain regions 204 via the circuit patterns 208.

The through electrodes 225, which may be through silicon vias (TSVs), may be formed in the wafer 200. The through electrodes 225 may be formed by patterning the wafer 200 to form trench holes 220 having a predetermined depth from the front-side surface 200a toward the back-side surface 200b, by forming a barrier layer 222 on inner surfaces of the trench holes 220, by forming a through metal layer filling the trench holes 220 surrounded by the barrier layer 222, and by planarizing the through metal layer and the barrier layer 222 to form separate through metal electrodes 224 in the trench holes 220. The through electrodes 225 may be formed to be spaced apart from each other by a predetermined distance. The through metal electrodes 224 may be formed to include a copper material, a silver material or a tin material. The barrier layer 222 may be formed to prevent metal atoms or metal ions in the through metal electrodes 224 from being diffused into the wafer 200. Each of the through electrodes 225 may be formed to have a first end surface 225a adjacent to the front-side surface 200a of the wafer 200. The circuit patterns 208 may be formed to be connected to the first end surfaces 225a of the through electrodes 225.

Bonding pads 210 may be formed on the through electrodes 225. The bonding pads 210 may be formed to be electrically connected to the through electrodes 225 via the circuit patterns 208. The bonding pads 210 may be electrically connected to an external circuit substrate (not shown) or the like. An insulation layer 212 may be formed on the interlayer insulation layer 206 to cover the bonding pads 210 and the circuit patterns 208. The insulation layer 212 may then be patterned to form openings 214 that expose the bonding pads 210.

The processes described above are performed while the wafer 200 is oriented such that the initial back-side surface 200b is provided as the bottom surface of the wafer 200 and the front-side surface 200a is provided as the top surface of the wafer 200, as shown by the orientation of FIG. 3. After the carrier substrate 227 is attached to the front-side bumps 219 using the adhesive layer 226, the wafer 200 is turned over so that the initial back-side surface 200b of the wafer 200 is provided as the top surface of the wafer 200 and the front-side surface 200a is provided as the bottom surface of the wafer 200, as shown in FIG. 4.

Front-side bumps 219 may be formed on the exposed bonding pads 210. Each of the front-side bumps 219 may be formed to include a metal pillar 216 and a solder bump 218 which are stacked on the bonding pad 210. The metal pillar 216 may have a cylindrical shape. However, embodiments are not limited thereto. For example, in some embodiments, the metal pillar 216 may be formed to have a polygonal cross-sectional profile. The solder bump 218 on the metal pillar 216 may have a semicircular profile in a cross-sectional view, as illustrated in FIG. 3. More specifically, the solder bump 218 may have a hemispherical outer surface.

Figure 4:
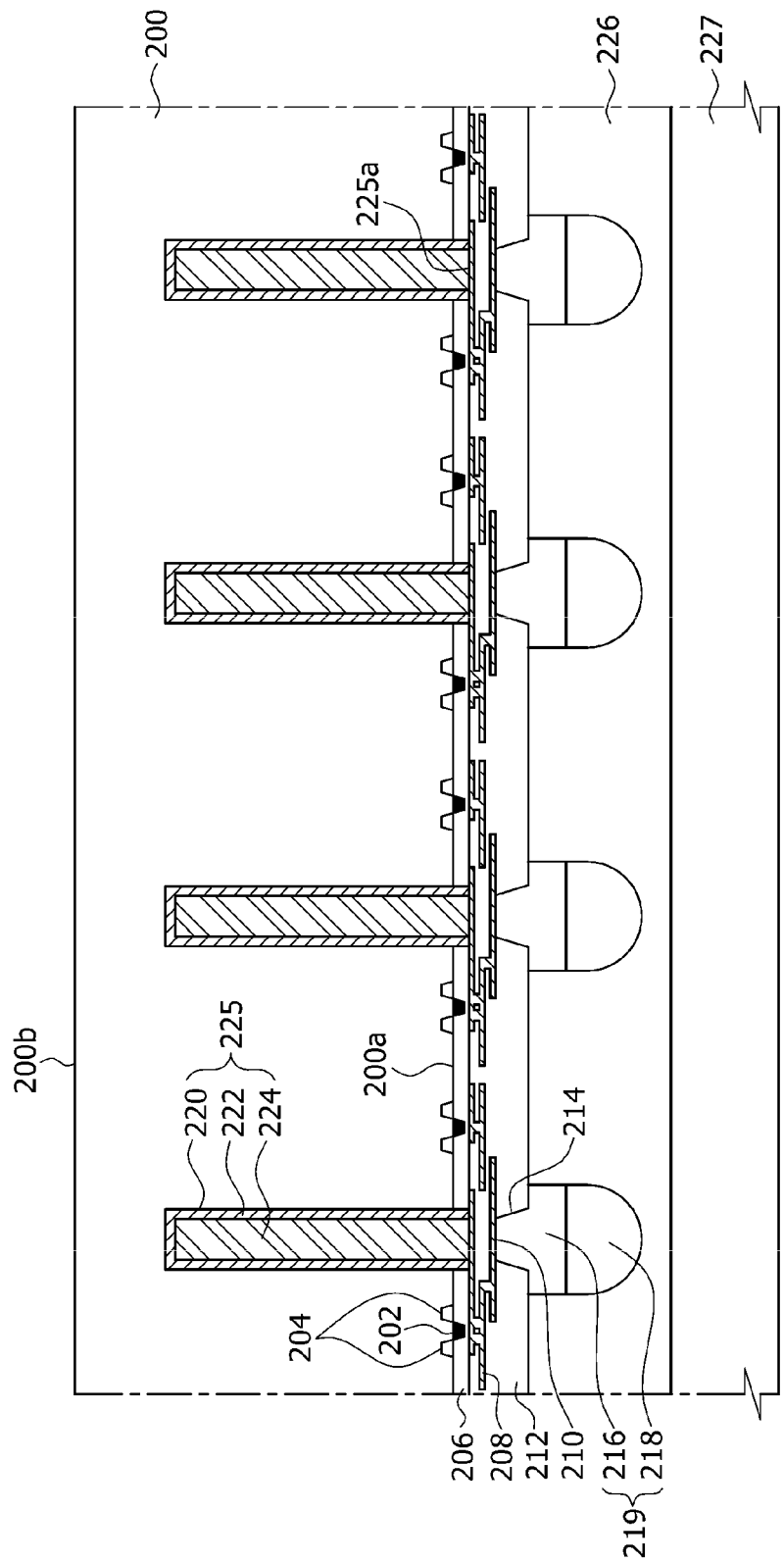

Referring to FIG. 4, a carrier substrate 227 may be attached to the front-side bumps 219 formed on the front-side surface 210a of the wafer 200. The carrier substrate 227 may be attached to the front-side bumps 219 using an adhesive layer 226. The adhesive layer 226 may be formed to a sufficient thickness to cover all of the front-side bumps 219.

Figure 5:
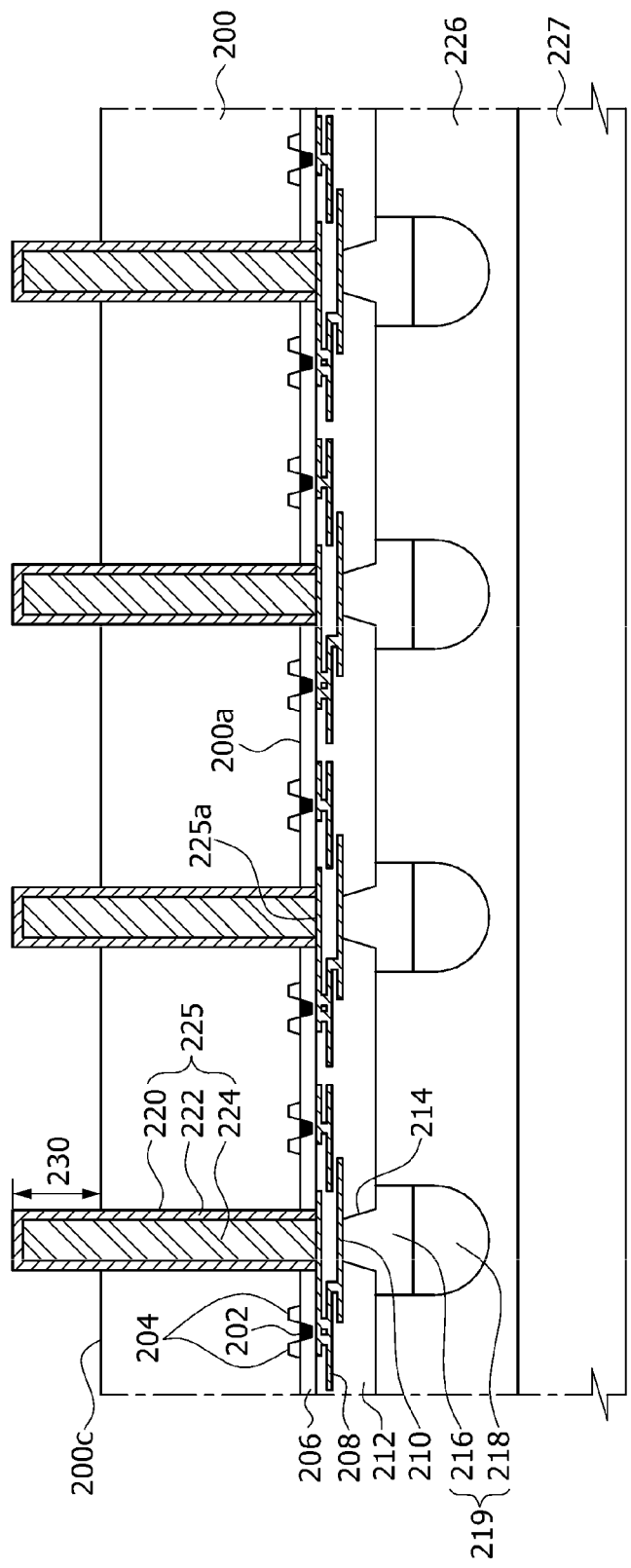

Referring to FIG. 5, an etch process may be applied to the back-side surface (200b of FIG. 4) to expose backside end portions of the through electrodes 225. Specifically, a grinding process may be applied to the back-side surface 200b to remove a portion of the wafer 200 by a predetermined thickness, and the wafer 200 may be selectively etched using an etch process to expose the backside end portions of the through electrodes 225 and to form a recessed back-side surface 200c. The etch process may be performed using a dry etch process or a wet etch process. As a result of the etch process, the backside end portions of the through electrodes 225 may protrude from the recessed back-side surface 200c of the wafer 200 by a predetermined height 230. In some embodiments, the back-side surface 200b of the wafer 200 may be recessed using at least one selected from a grinding process, a chemical mechanical polishing (CMP) process, an isotropic etch process and an anisotropic etch process.

Figure 6:
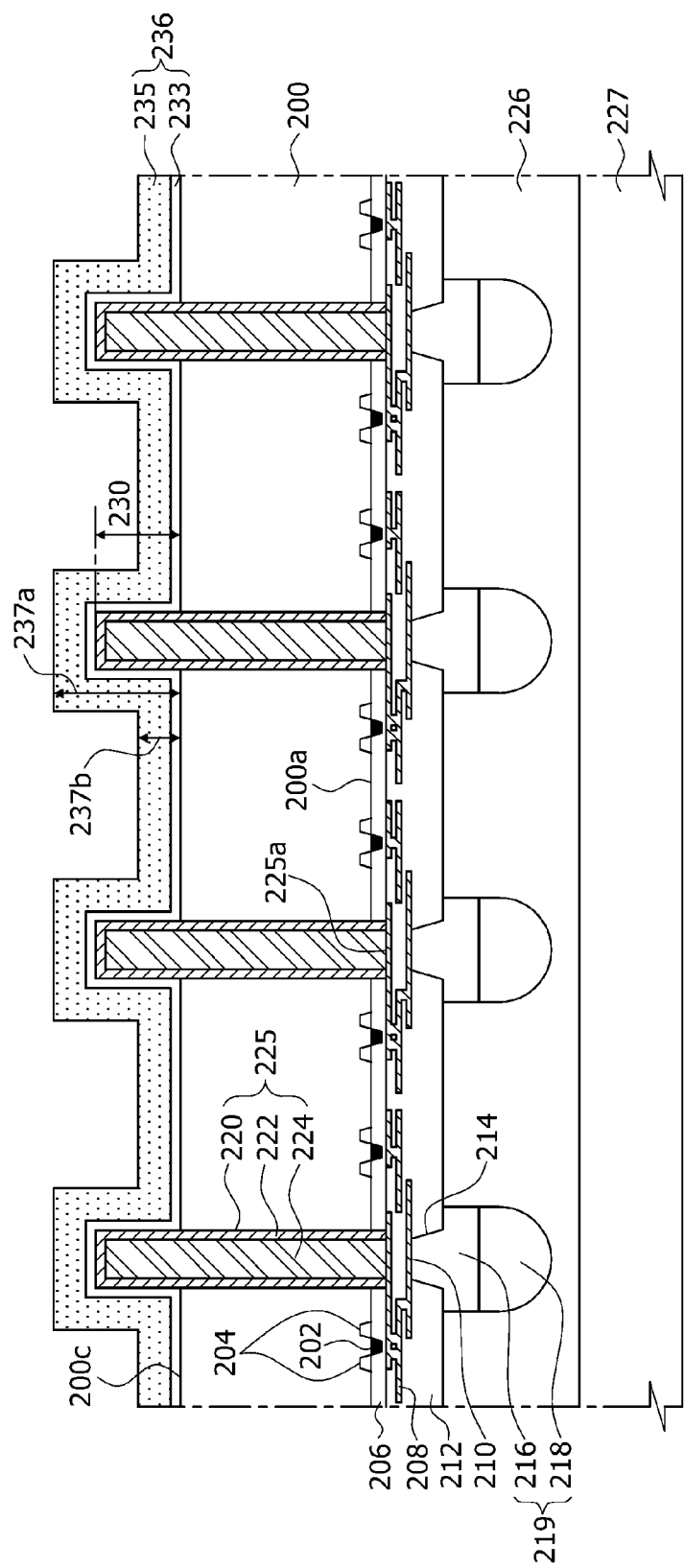

Referring to FIG. 6, a passivation layer 236 may be formed on the recessed back-side surface 200c of the wafer 200 and the protrusions of the through electrodes 225. The passivation layer 236 may be formed to a thickness sufficient to cover the protrusions of the through electrodes 225. The passivation layer 236 may be formed by sequentially stacking a first insulation layer 233 and a second insulation layer 235 on the recessed back-side surface 200c of the wafer 200 and the protrusions of the through electrodes 225. A thickness of the passivation layer 236 including the first and second insulation layers 233 and 235 may be different according to a position of the passivation layer 236. For example, the passivation layer 236 adjacent to the sidewalls of the protrusions of the through electrodes 225 may be formed to have a first thickness 237a which is greater than the height 230 of the protrusions of the through electrodes 225, and the passivation layer 236 far from the sidewalls of the protrusions of the through electrodes 225 may be formed to have a second thickness 237b which is less than the first thickness 237a. The second insulation layer 235 may be formed of a material layer having an etch selectivity with respect to the first insulation layer 233. For example, if the first insulation layer 233 includes a nitride layer, the second insulation layer 235 may include an oxide layer. Although FIG. 6 illustrates an example in which the passivation layer 236 includes two different layers of the first and second insulation layers 233 and 235, embodiments are not limited thereto. For example, the passivation layer 236 may have a multi-layered structure which is fabricated by repeatedly stacking at least two different material layers in an alternating pattern. Alternatively, the passivation layer 236 may be a single material layer.

Figure 7:
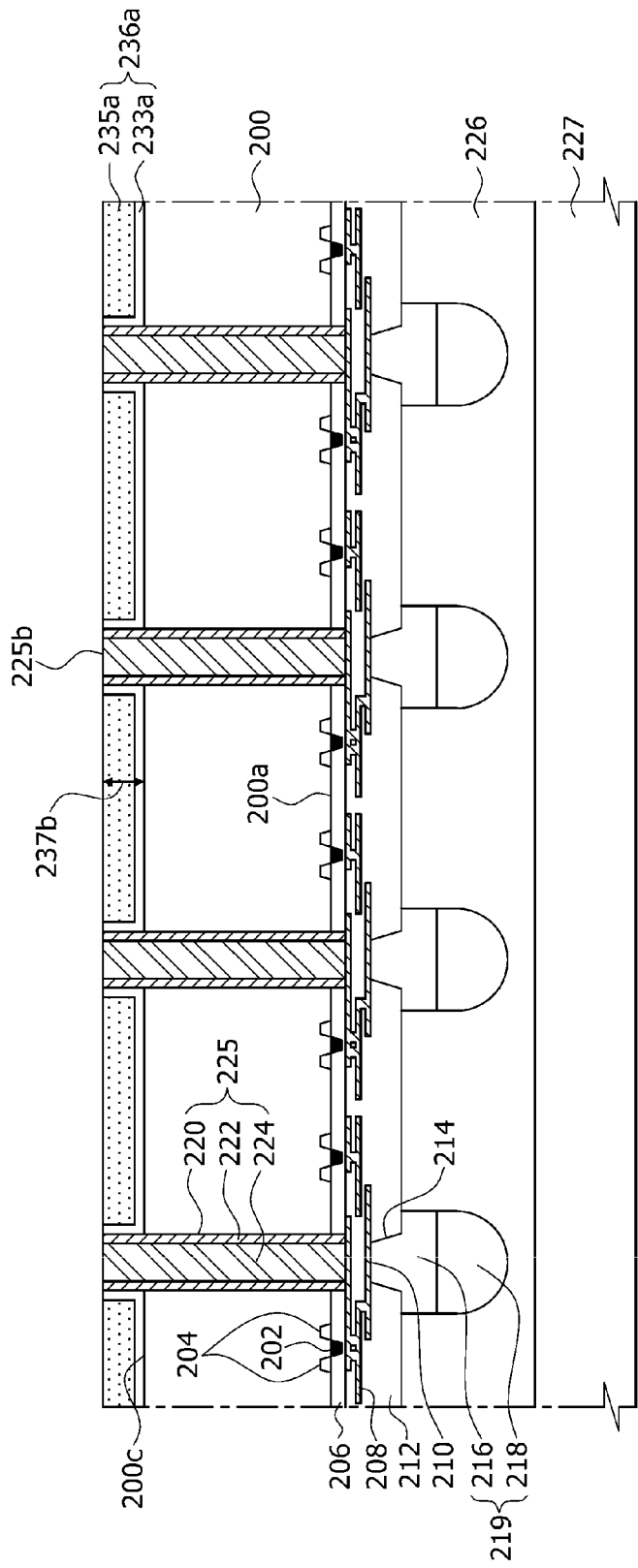

Referring to FIG. 7, a planarization process may be applied to the passivation layer 236 to form a passivation pattern 236a. As a result of the planarization process, second end surfaces 225b of the through electrodes 225 opposite to the front-side bumps 219 may be exposed. The passivation pattern 236a may be formed to include a first insulation pattern 233a and a second insulation pattern 235a. The planarization process for forming the passivation pattern 236a may be a chemical mechanical polishing (CMP) process. During the planarization process applied to the passivation layer 236, backside end portions of the through electrodes 225 may be removed such that the second end surfaces 225b of the through electrodes 225 are coplanar with a top surface of the passivation pattern 236a having the second thickness 237b. Accordingly, each of the second end surfaces 225b of the through electrodes 225 may include a surface of the through metal electrode 224 and a surface of the barrier layer 222.

Figure 8:
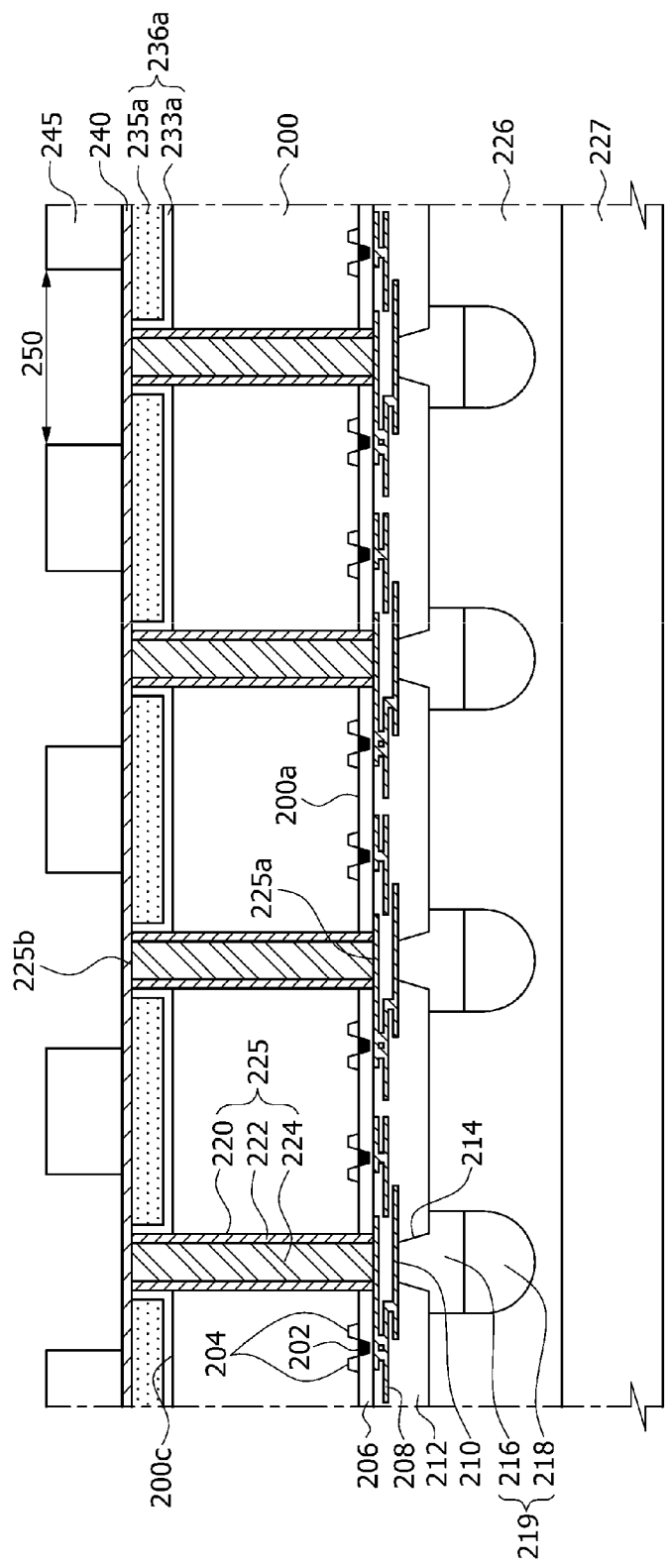

Referring to FIG. 8, a seed metal layer 240 may be formed on the passivation pattern 236a to cover the second end surfaces 225b of the through electrodes 225. Although not shown in the drawings, an adhesive layer may be additionally formed on the passivation pattern 236a before forming the seed metal layer 240. The adhesive layer may be formed to improve an adhesive strength between the passivation pattern 236a and the seed metal layer 240. The adhesive layer may be formed to include at least one selected from the group consisting of a titanium (Ti) material, a tungsten (W) material and a titanium-tungsten (TiW) material. If the adhesive layer is formed on the passivation pattern 236a, the seed metal layer 240 may be formed on the adhesive layer. The seed metal layer 240 may be formed of a copper layer using a chemical vapor deposition (CVD) process or a physical vapor deposition (PVD) process.

Subsequently, a mask pattern 245 having openings 250 may be formed on the seed metal layer 240. The openings 250 may define regions in which back-side bumps are formed. Specifically, a photoresist material may be deposited over an entire surface of the seed metal layer 240. The photoresist material may be patterned using an exposure process and a development process to form the mask pattern 245 having the openings 250 that expose portions of the seed metal layer 240. The openings 250 may be located to expose the through electrodes 225.

Figure 9:
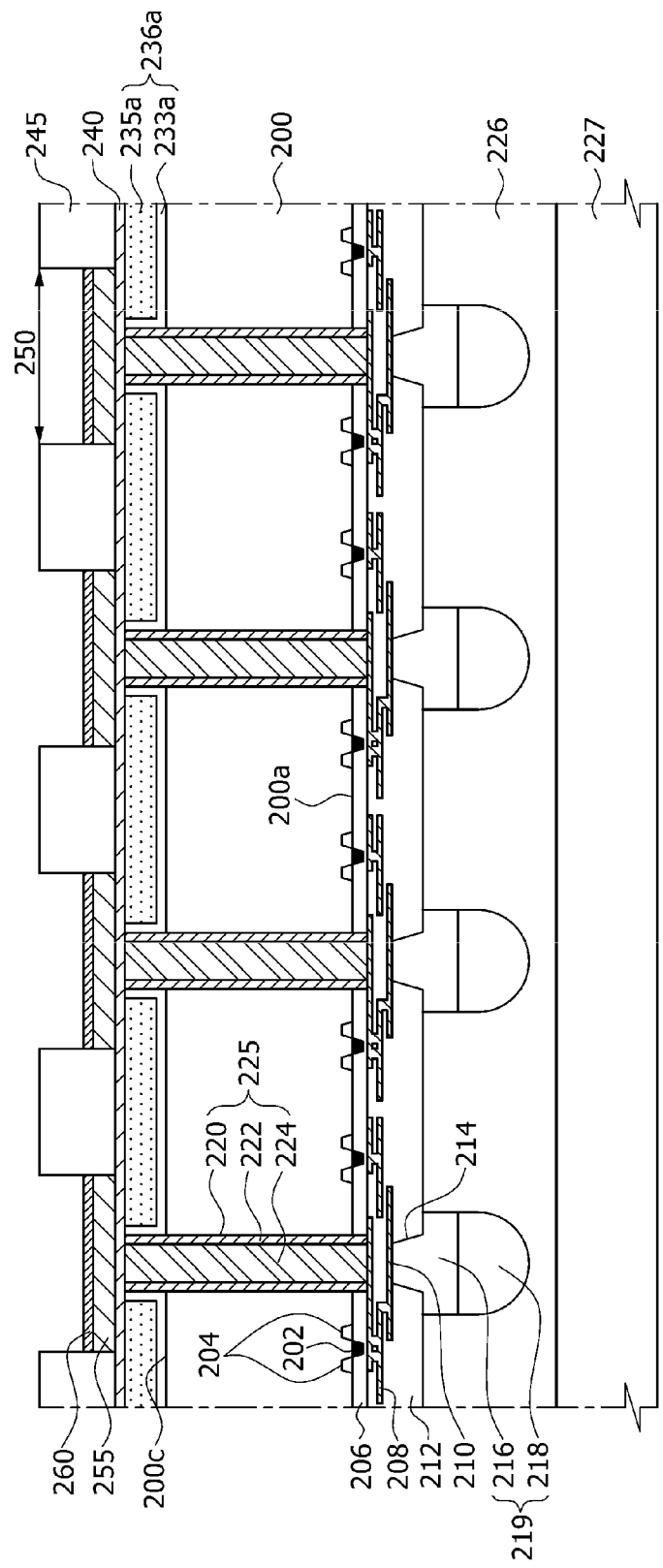

Referring to FIG. 9, a first metal layer 255 and a second metal layer 260 may be sequentially formed on portions of the seed metal layer 240 exposed by each of the openings 250. The first and second metal layers 255 and 260 may be formed using an electroplating process. If the first and second metal layers 255 and 260 are formed using an electroplating process, the first and second metal layers 255 and 260 may be selectively grown on portions of the seed metal layer 240, which are exposed by the openings 250. The first metal layers 255 may be formed to include a copper material, and the second metal layers 260 may be formed to include a nickel material or a gold material.

Figure 10:
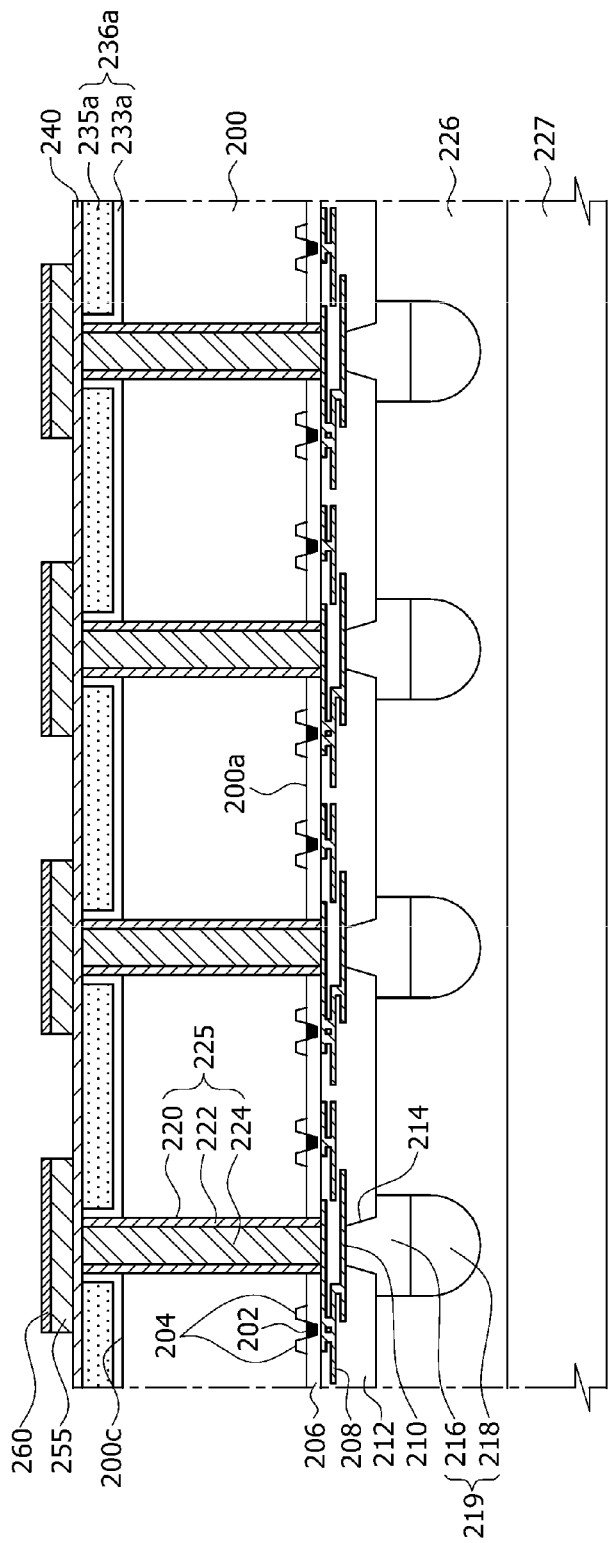

Referring to FIG. 10, the mask pattern (245 of FIG. 9) may be removed using an ashing process or a strip process. As a result of removal of the mask pattern 245, a portion of the seed metal layer 240 that was covered with the mask pattern 245 may be exposed.

Figure 11:
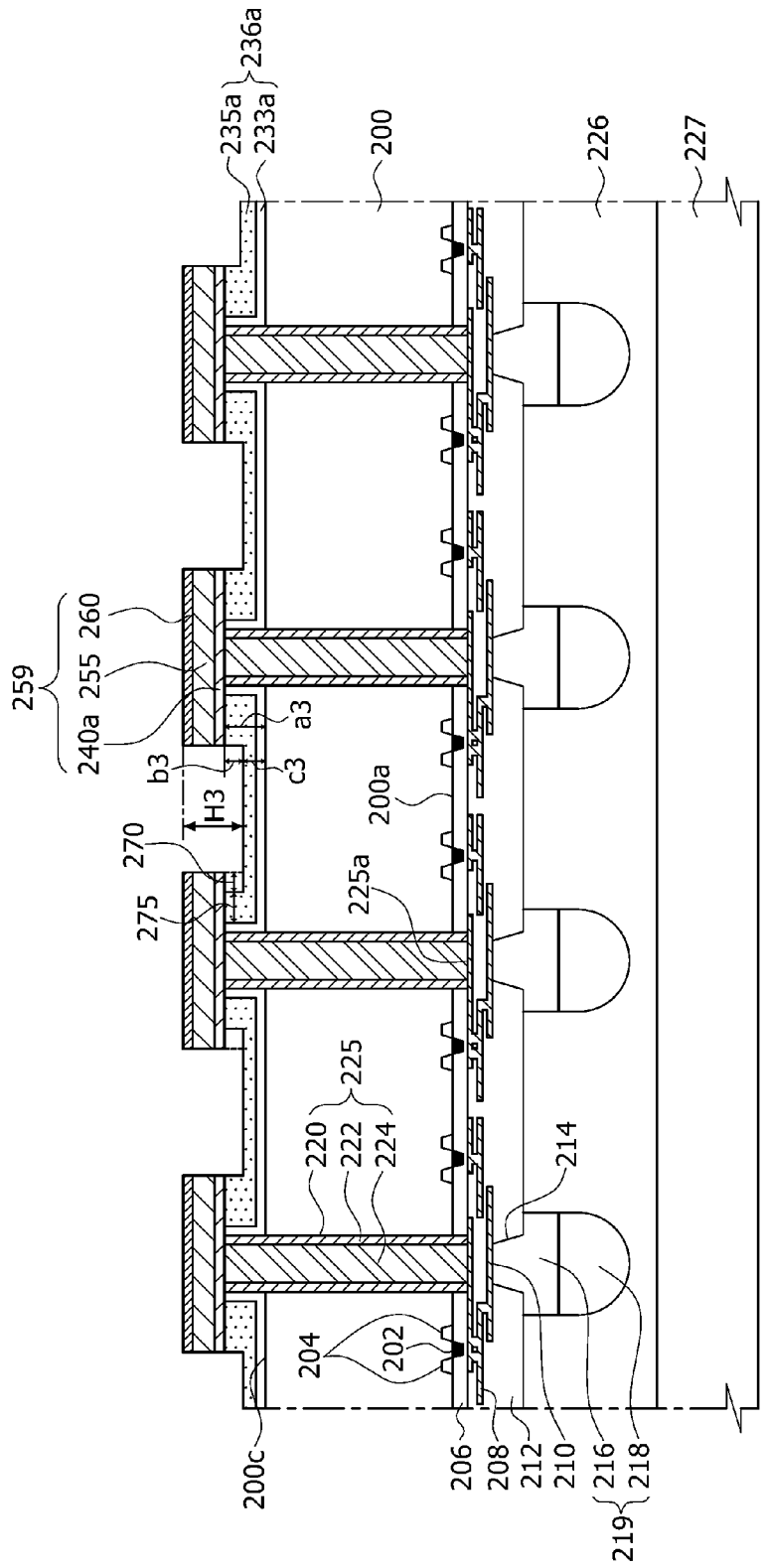

Referring to FIG. 11, the exposed portions of the seed metal layer 240 may be selectively etched to form seed metal patterns 240a remaining under the first metal layers 255. While the exposed portions of the seed metal layer 240 are etched, the first and second metal layers 255 and 260 may function as etch masks. Thus, the exposed portion of the seed metal layer 240 may be selectively etched using a blanket etch process, for example, a dry etch process that does not use photo masks. The blanket etch process applied to the seed metal layer 240 may be performed to remove portions of the seed metal layer 240 that are not covered by the first and second metal layers 255 and 260. As a result, back-side bumps 259 including the seed metal patterns 240a, the first metal layers 255 and the second metal layers 260 may be formed. An adhesive metal layer (not shown) may be additionally formed on the second metal layers 260. The adhesive metal layer may be formed to include a silver material and a tin material.

While the seed metal layer 240 is etched to form the seed metal patterns 240a, the second insulation pattern 235a of the passivation pattern 236a may be etched past the seed metal layer 240 to form a recessed region having a predetermined depth b3. Accordingly, a portion of the passivation pattern 236a under the back-side bump 259 may have a first thickness a3 and a portion of the passivation pattern 236a in a non-overlapping region of the back-side bump 259 and the wafer 200 may have a second thickness c3, which is less than the first thickness a3 by the predetermined depth b3. Thus, a height H3 of the back-side bump 259 from a top surface of a portion of the passivation pattern 236a may be a sum of the second thickness c3 and the predetermined depth b3.

Figure 12:
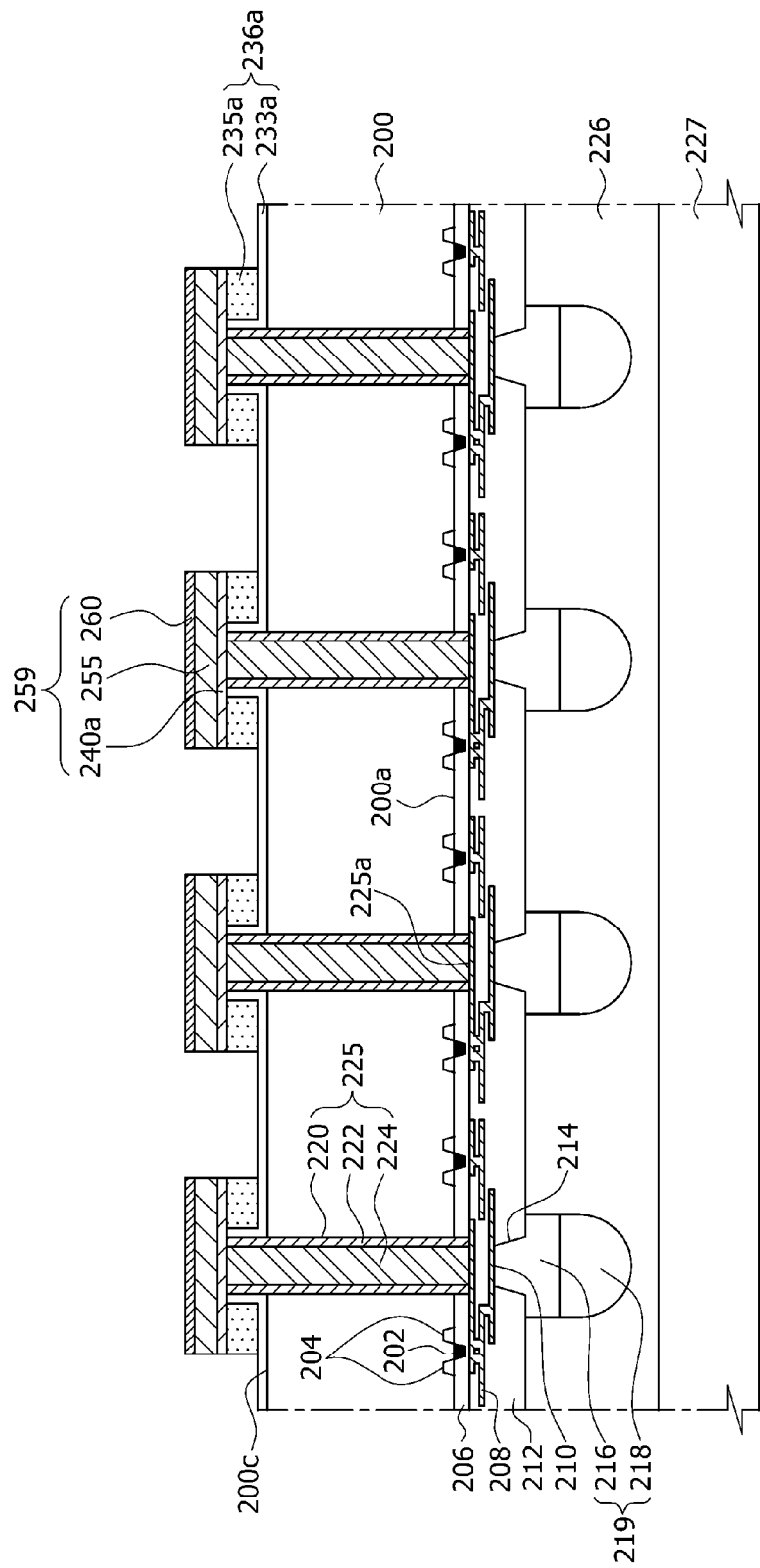

The first insulation pattern 233a and the second insulation pattern 235a constituting the passivation pattern 236a may exhibit different etch rates in a certain etchant or a certain etch gas. That is, the second insulation pattern 235a may be formed to have an etch selectivity with respect to the first insulation pattern 233a. Thus, even though the second insulation pattern 235a is over-etched when the seed metal layer 240 is etched to form the seed metal patterns 240a, the first insulation pattern 233a may be minimally etched to maintain substantially the same thickness as its original thickness. For example, as illustrated in FIG. 12, even when an etching process performed on the second insulation pattern 235a exposes the first insulation pattern 233a when the seed metal layer 240 is etched to form the seed metal patterns 240a, the first insulation pattern 233a may function as an etch stop layer to prevent the underlying material layers from being damaged. That is, even though a blanket etch process is applied to the seed metal layer 240 to form the seed metal patterns 240a without use of any photo masks, the first insulation pattern 233a may still remain on the recessed back-side surface 200c of the wafer 200 and prevent the wafer 200 from being damaged by etch sources used in the blanket etch process.

Moreover, sidewalls of the protrusions of the through electrodes 225 may be covered with the passivation pattern 236a. Thus, even though the etch sources of the blanket etch process may be infiltrated in a lateral direction 270 during the blanket etch process for forming the seed metal patterns 240a, the portion of passivation pattern 236a having the first thickness a3 may prevent the protrusions of the through electrodes 225 from being damaged.

Meanwhile, when a plurality of wafers 200 including the through electrodes 225 and the bumps 219 and 259 are vertically stacked, electrical connections between the wafers 200 may be more successfully made because the back-side bump 259 has the height H3 which extends above the passivation pattern 236a by the predetermined depth b3. Aspects of this feature will be described below with reference to FIG. 13.

Figure 13:
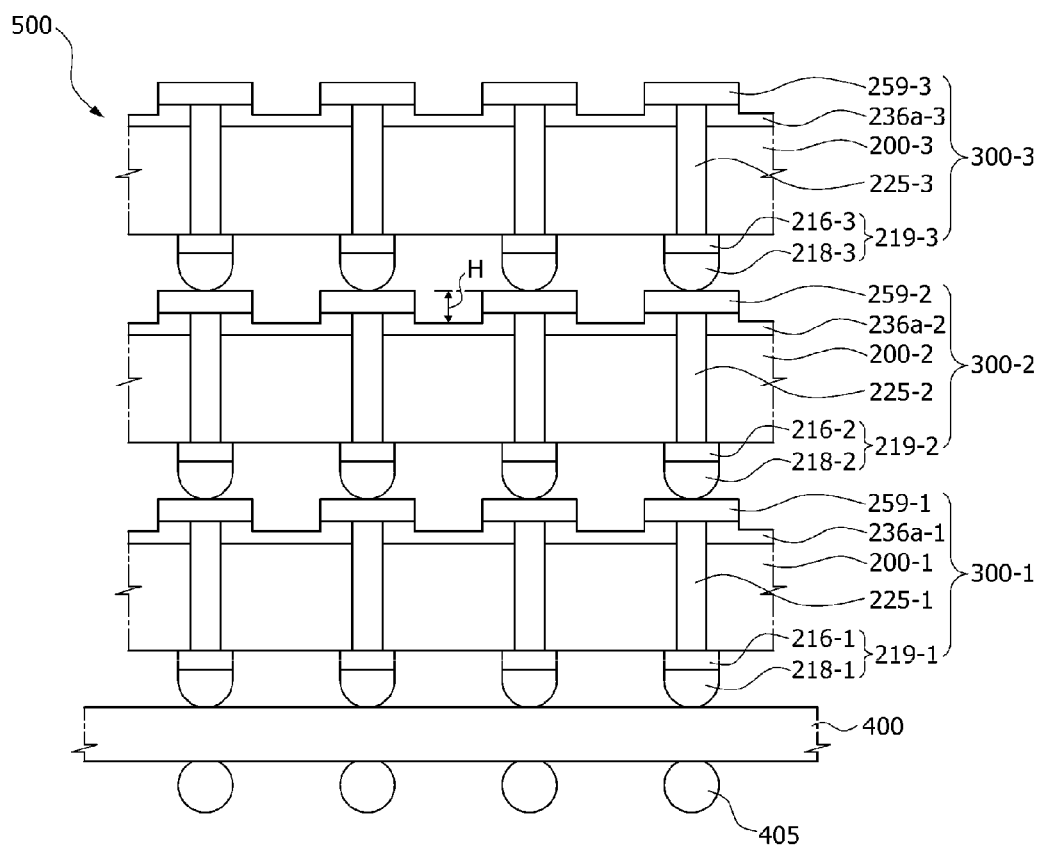
FIG. 13 is a cross-sectional view illustrating a semiconductor package including semiconductor devices according to some embodiments.

Referring to FIG. 13, a semiconductor package according to an embodiment may include a package substrate 400 and at least two semiconductor chips 300 disposed over the package substrate 400. The at least two semiconductor chips may include a first semiconductor chip 300-1, a second semiconductor chip 300-2 and a third semiconductor chip 300-3 which are vertically stacked on the package substrate 400. The first semiconductor chip 300-1 corresponding to a lowermost chip may be attached to a top surface of the package substrate 400. Although not shown in the drawing, a plurality of interconnection lines may be disposed in or on the package substrate 400. External connection members 405 including solder balls may also be disposed on a bottom surface of the package substrate 400 opposite to the first semiconductor chip 300-1. Each of the semiconductor chips 300 may be a chip according to embodiments of this disclosure, such as the chip of FIG. 1.

The first semiconductor chip 300-1 may include a semiconductor layer 200-1 such as a silicon layer, through electrodes 225-1 penetrating the semiconductor layer 200-1, front-side bumps 219-1 disposed on a front-side surface of the semiconductor layer 200-1 and electrically connected to respective through electrodes 225-1, and back-side bumps 259-1 disposed on a back-side surface of the semiconductor layer 200-1 and electrically connected to respective through electrodes 225-1. The second semiconductor chip 300-2 may include a semiconductor layer 200-2 such as a silicon layer, through electrodes 225-2 penetrating the semiconductor layer 200-2, front-side bumps 219-2 disposed on a front side surface of the semiconductor layer 200-2 and electrically connected to respective through electrodes 225-2, and back-side bumps 259-2 disposed on a back-side surface of the semiconductor layer 200-2 and electrically connected to respective through electrodes 225-2. Similarly, the third semiconductor chip 300-3 may include a semiconductor layer 200-3 such as a silicon layer, through electrodes 225-3 penetrating the semiconductor layer 200-3, front-side bumps 219-3 disposed on a front-side surface of the semiconductor layer 200-3 and electrically connected to respective through electrodes 225-3, and back-side bumps 259-3 disposed on a back-side surface of the semiconductor layer 200-3 and electrically connected to respective through electrodes 225-3.

Backside end portions of the through electrodes 225-1 may protrude from the back-side surface of the semiconductor layer 200-1. Backside end portions of the through electrodes 225-2 may also protrude from the back-side surface of the semiconductor layer 200-2. Similarly, backside end portions of the through electrodes 225-3 may protrude from the back-side surface of the semiconductor layer 200-3.

A passivation pattern 236a-1 may be disposed between the back-side bumps 259-1 and the semiconductor layer 200-1 and surround sidewalls of the backside end portions of the through electrodes 225-1 and may extend onto the back-side surface of the semiconductor layer 200-1. A passivation pattern 236a-2 may be disposed between the back-side bumps 259-2 and the semiconductor layer 200-2 to surround sidewalls of the backside end portions of the through electrodes 225-2 and may extend onto the back-side surface of the semiconductor layer 200-2. A passivation pattern 236a-3 may be disposed between the back-side bumps 259-3 and the semiconductor layer 200-3 and surround sidewalls of the backside end portions of the through electrodes 225-3 and may extend onto the back-side surface of the semiconductor layer 200-3. Each of the passivation patterns 236a-1, 236a-2 and 236a-3 may include a plurality of layers having different etch rates in a certain etchant or a certain etch gas.

The passivation pattern 236a-1 may have a first thickness at a position under the back-side bumps 259-1 and a second thickness, which is less than the first thickness, at a position on the back-side surface of the semiconductor layer 200-1 that does not overlap with the back-side bumps 259-1. The passivation pattern 236a-2 may also have the first thickness at a position under the back-side bumps 259-2 and the second thickness, which is less than the first thickness, at a position on the back-side surface of the semiconductor layer 200-2 that does not overlap with the back-side bumps 259-2. Similarly, the passivation pattern 236a-3 may also have the first thickness at a position under the back-side bumps 259-3 and the second thickness, which is less than the first thickness, at a position on the back-side surface of the semiconductor layer 200-3 that does not overlap with the back-side bumps 259-3. Accordingly, a height H of the back-side bumps 259-1, 259-2 and 259-3 may protrude by a difference between the first and second thicknesses. Thus, when the first, second and third semiconductor chips 300-1, 300-2 and 300-3 are vertically stacked, electrical connections between the stacked semiconductor chips 300-1, 300-2 and 300-3 may be more successfully realized because the back-side bump 259 has the height H1 which is relatively increased even when heights of the front-side bumps 219-1, 219-2 and 219-3 are non-uniform.

The packages described above may be applied to various electronic systems.

Figure 14:
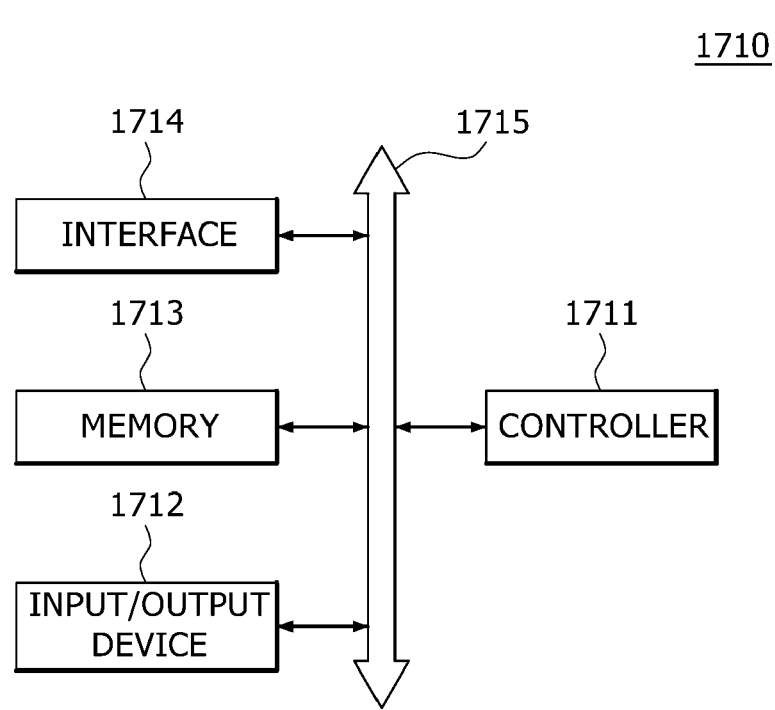
FIG. 14 is a block diagram illustrating an electronic system including a package according to an embodiment.

Referring to FIG. 14, a package in accordance with an embodiment may be applied to an electronic system 1710. The electronic system 1710 may include a controller 1711, an input/output unit 1712, and a memory 1713. The controller 1711, the input/output unit 1712, and the memory 1713 may be coupled with one another through a bus 1715 providing a path through which data are transmitted.

For example, the controller 1711 may include at least any one of at least one microprocessor, at least one digital signal processor, at least one microcontroller, and logic devices capable of performing the same functions as these components. At least one of the controller 1711 and the memory 1713 may include at least any one of the packages according to embodiments of the present disclosure. The input/output unit 1712 may include at least one selected among a keypad, a keyboard, a display device, a touch screen and so forth. The memory 1713 is a device for storing data. The memory 1713 may store data and/or commands to be executed by the controller 1711, and the like.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 1710 may stably store a large amount of data in a flash memory system.

The electronic system 1710 may further include an interface 1714 suitable for transmitting and receiving data to and from a communication network. The interface 1714 may be a wired or wireless type. For example, the interface 1714 may include an antenna or a wired or wireless transceiver.

The electronic system 1710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

In an embodiment wherein the electronic system 1710 is an equipment capable of performing wireless communication, the electronic system 1710 may be used in a communication system such as a system employing one or more of CDMA (code division multiple access), GSM (global system for mobile communications), NADC (North American digital cellular), E-TDMA (enhanced-time division multiple access), WCDMA (wideband code division multiple access), CDMA2000, LTE (long term evolution), and Wibro (wireless broadband Internet).

Figure 15:
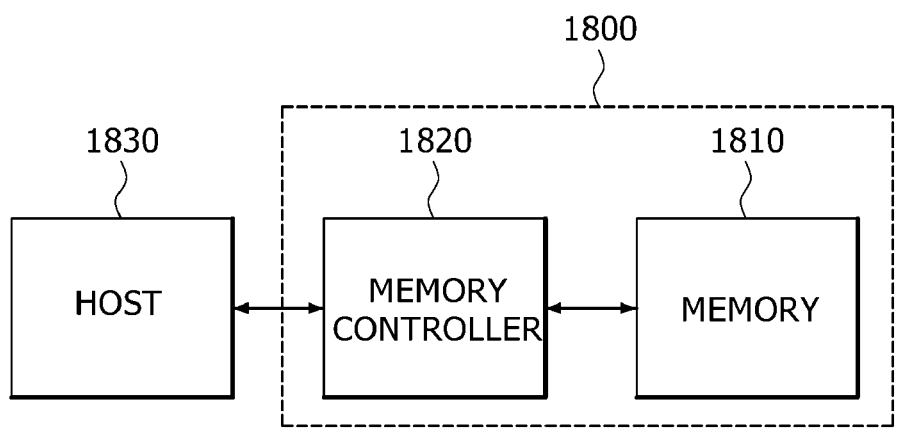
FIG. 15 is a block diagram illustrating another electronic system including a package according to an embodiment.

Referring to FIG. 15, the package in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least one nonvolatile memory device to which the packaging technologies of embodiments of the present disclosure are applied. The memory controller 1820 may control the memory 1810 such that stored data is read out or data is stored in response to a read/write request from a host 1830.

The embodiments of the present disclosure have been disclosed for illustrative purposes. Those skilled in the art will appreciate that various modifications, additions and substitutions are possible, without departing from the scope disclosed in the accompanying claims.

What is claimed is:

1. A semiconductor device comprising:
a semiconductor layer having a first surface and a second surface;
a through electrode penetrating the semiconductor layer and having a protruding portion that protrudes over the second surface of the semiconductor layer by a predetermined height;
a front-side bump disposed over the first surface of the semiconductor layer and electrically coupled to the through electrode;
a passivation pattern including a first insulation pattern that surrounds a sidewall of the protrusion of the through electrode and extends onto the second surface of the semiconductor layer and a second insulation pattern that covers the first insulation pattern and has an etch selectivity with respect to the first insulation pattern, wherein a portion of the passivation pattern under the back-side bump has a first thickness and a portion of the passivation pattern on the second surface of the semiconductor layer that does not overlap with the back-side bump has a second thickness which is less than the first thickness; and
a back-side bump covering an end surface of the protruding portion of the through electrode and extending over the passivation pattern.

2. The semiconductor device of claim 1, wherein the first surface of the semiconductor layer is a front-side surface adjacent to active regions of the semiconductor layer, and the second surface of the semiconductor layer is a back-side surface is opposite to the front-side surface.

3. The semiconductor device of claim 1, wherein the through electrode includes a first end surface adjacent to the first surface of the semiconductor layer and the protruding portion has a second end surface.

4. The semiconductor device of claim 3, wherein the second end surface of the through electrode is coplanar with a surface of the passivation pattern.

5. The semiconductor device of claim 1, wherein the first insulation pattern includes a nitride layer and the second insulation pattern includes an oxide layer.

6. The semiconductor device of claim 1, wherein the front-side bump includes a metal pillar and a solder bump disposed over the metal pillar.

7. The semiconductor device of claim 1, wherein the backside bump includes a seed metal pattern, a first metal layer disposed over the seed metal pattern, and a second metal layer disposed over the first metal layer.

\* \* \* \* \*